(12) United States Patent
Tusan et al.

(10) Patent No.: US 6,567,274 B1
(45) Date of Patent: May 20, 2003

(54) FACEPLATE

(75) Inventors: Robert Tusan, Laguna Niguel, CA (US); Tahsin Khairi, Yorba Linda, CA (US)

(73) Assignee: ADC DSL Systems, Inc., Eden Prairie, MN (US)

( * ) Notice: Subject to any disclaimer, the term of this patent is extended or adjusted under 35 U.S.C. 154(b) by 0 days.

(21) Appl. No.: 10/062,252

(22) Filed: Jan. 31, 2002

(51) Int. Cl.⁷ .................................................. H05K 1/14
(52) U.S. Cl. .................... 361/740; 361/741; 361/796; 361/798; 361/801; 361/756; 361/759
(58) Field of Search .................... 361/801, 726, 361/732, 740, 747, 759, 802, 741, 756, 685, 816, 818, 800, 799, 753, 728, 752, 754, 796, 797, 798; 312/223.1, 223.2; 211/41.17, 26.2; 439/116–119

(56) References Cited

U.S. PATENT DOCUMENTS

| | | | |
|---|---|---|---|
| 4,301,494 A | * | 11/1981 | Jordan .......................... 361/798 |
| 4,614,389 A | * | 9/1986 | Albert et al. ................. 439/144 |
| 4,632,588 A | | 12/1986 | Fitzpatrick |
| 4,648,009 A | | 3/1987 | Beun et al. |
| 5,434,752 A | * | 7/1995 | Huth et al. ................... 361/798 |
| 6,269,007 B1 | | 7/2001 | Pongracz et al. |

* cited by examiner

*Primary Examiner*—David Martin
*Assistant Examiner*—Phuong T. Vu
(74) *Attorney, Agent, or Firm*—Fogg and Associates, LLC

(57) ABSTRACT

An embodiment of the present invention provides a faceplate for a circuit board. The faceplate has first and second prongs protruding from a first end of the faceplate respectively at first and second sides of the faceplate. The first and second prongs are adapted to engage a housing to aid in inserting the circuit board into the housing. A tab protrudes from the first end of the faceplate at a front of the faceplate. The tab lies substantially between the first and second prongs. The tab is adapted to engage the housing to aid in extracting the circuit board from the housing.

54 Claims, 12 Drawing Sheets

FACEPLATE

TECHNICAL FIELD

The present invention relates generally to the field of electronic circuit cards and, in particular, to faceplates for electronic circuit cards.

BACKGROUND

Electronic circuit cards are frequently deployed at central offices, remote units, such as digital loop carriers, or the like of telecommunication systems. One example of an electronic circuit card is a line card that is typically used in telecommunication systems to provide an interface between a data network, e.g., the Internet, and subscribers. Data are usually received in the form of DS1 signals at line cards from the data network. The line cards convert the DS1 signals to an HDSL format and transmit the data in the HDSL format to subscribers. The subscribers also transmit data in the HDSL format to line cards that convert the data into DS1 signals and transmit the DS1 signals to the data network.

Line cards are usually contained in housings. Many line cards include a faceplate that is attached to a circuit board of the line card. The faceplate typically serves to identify for the end user the functions of any ports, LEDs, switches or displays of the circuit board. In addition, many faceplates, for example, protect both an end user and the circuit board's electronics against electromagnetic interference (EMI) and electrostatic discharge (ESD). Line cards are typically inserted into the housing and achieve an electrical connection, for example, by direct longitudinal force on the faceplate, by a latch that is a part of the circuit board, or by pivoting the faceplate relative to the circuit board.

In one example, a single prong of the faceplate engages the housing to impart a longitudinal force to the circuit board for pushing the circuit board into the housing and into electrical contact with a socket within the housing. The single prong also often helps to hold the circuit board in place, e.g., helps to maintain electrical contact between the socket and the circuit board. Usually the single prong is attached to a back of the faceplate, for example, by spot-welding. However, these faceplates are expensive. Moreover, attaching the prong to the back of the faceplate uses area of the faceplate that can otherwise be used for elements of the line card, such as ports, LEDs, switches, or the like. In some instances, the single prong becomes deformed or bent after repeated insertions because the single prong bears forces during each insertion of the line card. Moreover, many circuit cards held in place by a single prong vibrate at vibration levels that can damage the circuit card, cause interference with circuitry, or the like.

For the reasons stated above, and for other reasons stated below that will become apparent to those skilled in the art upon reading and understanding the present specification, there is a need in the art for alternatives to existing faceplates for electronic circuit cards, such as line cards.

SUMMARY

The above-mentioned problems with faceplates for electronic cards and other problems are addressed by embodiments of the present invention and will be understood by reading and studying the following specification.

In one embodiment, a faceplate for a circuit board is provided. The faceplate has first and second prongs protruding from a first end of the faceplate respectively at first and second sides of the faceplate. The first and second prongs are adapted to engage a housing to aid in inserting the module into the housing. A tab protrudes from the first end of the faceplate at a front of the faceplate. The tab lies substantially between the first and second prongs. The tab is adapted to engage the housing to aid in extracting the module from the housing.

In another embodiment, an electronic circuit card having a circuit board and a faceplate pivotally attached to the circuit board is provided. Two prongs protrude from a first end of the faceplate so as to straddle the circuit board. Each of the two prongs is adapted to engage a housing to aid in inserting the circuit board into the housing as the faceplate pivots in a first direction relative to the circuit board. A tab protrudes from the first end of the faceplate and is adapted to engage the housing to aid in extracting the circuit board from the housing as the faceplate pivots in a second direction relative to the circuit board.

Further embodiments of the invention include methods and apparatus of varying scope.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Embodiments of the present invention provide faceplates for electronic circuit cards, such as line cards or the like. In one embodiment, a faceplate has two prongs protruding from an end of the faceplate respectively at each of two sides of the faceplate. This provides additional faceplate area for elements of the electronic circuit card, such as ports, LEDs, switches, or the like, compared to faceplates that have a single prong attached to the back of these faceplates. Moreover, each of the two prongs are less likely to become deformed or bent after repeated insertions of the electronic circuit card than a single prong because the two prongs bear forces during each insertion of the electronic circuit card otherwise born by the single prong. The two prongs also reduce the vibration of the electronic circuit card as compared to the vibration of electronic circuit cards having a single prong by providing two points of contact with the housing for improved stability.

Figure 1:
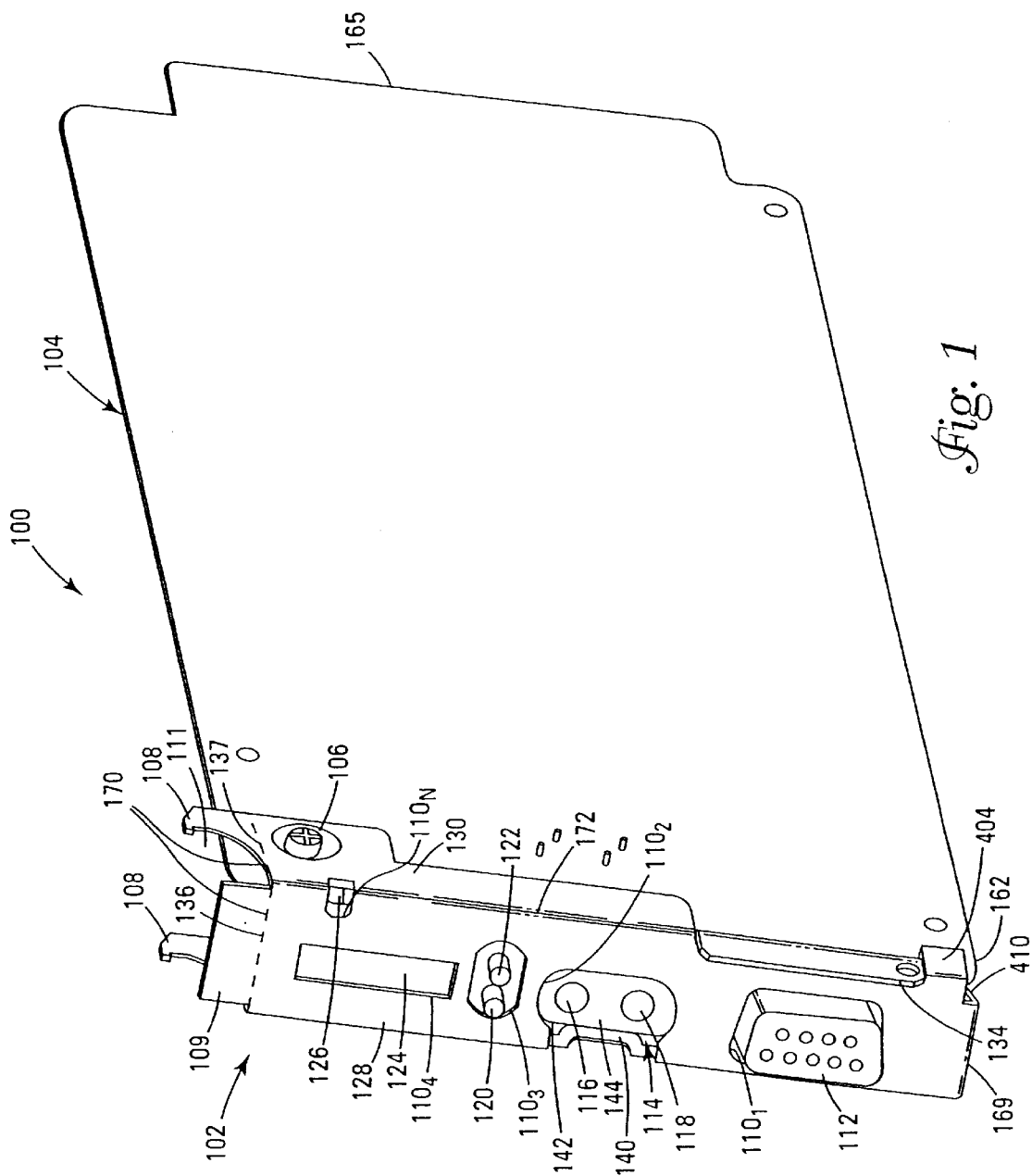
FIG. 1 is a right-side isometric view of an embodiment of an electronic circuit card according to the teachings of the present invention.
Figure 2:
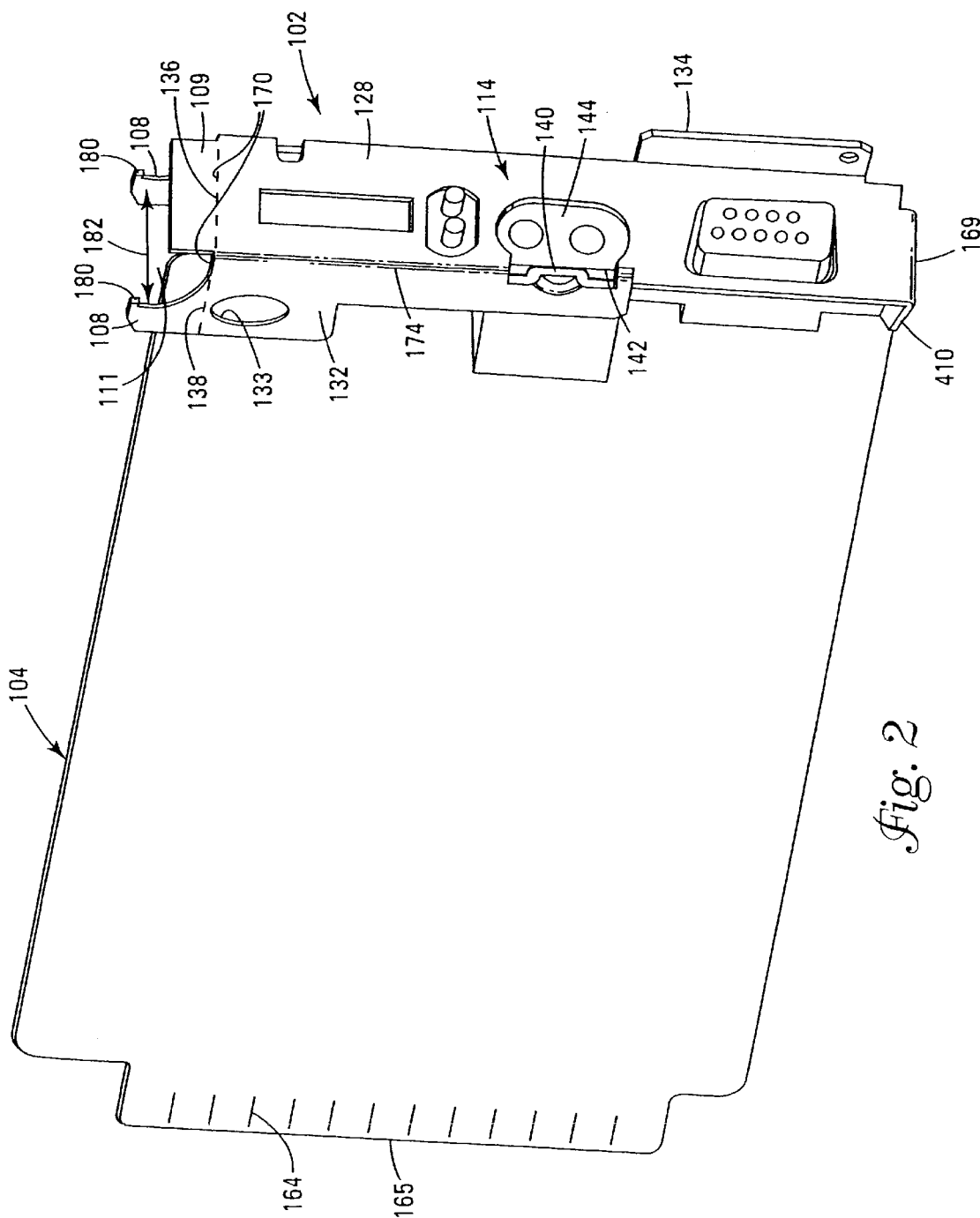
FIG. 2 is a left-side isometric view of the electronic circuit card of FIG. 1.
Figure 7:
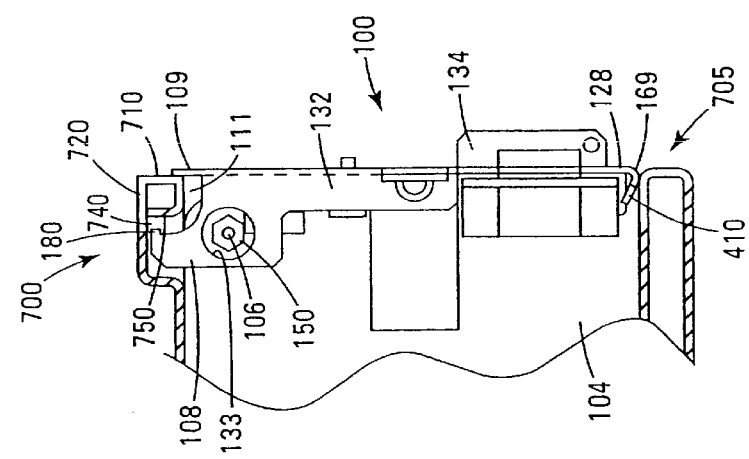

FIGS. 1 and 2 are respectively right- and left-side isometric views of an electronic circuit card 100, such as a line card (or central office module, e.g., an HDSL central office module) according to an embodiment of the present invention. Electronic circuit card 100 includes a faceplate 102 and a circuit board 104. In one embodiment, a pivot, e.g., a bolt 106, shaft, or the like, pivotally attaches faceplate 102 to circuit board 104. Each of a pair of prongs 108 protrudes from an end 170 of faceplate 102 respectively at sides 130 and 132 of faceplate 102. A tab 109 also protrudes from end 170 at a front 128 of faceplate 102 so that tab 109 lies substantially between prongs 108. In one embodiment, tab 109 is substantially perpendicular to the plane of each of prongs 108 and spans a distance 182 between prongs 108. A gap 111 lies between prongs 108 and tab 109 and receives a rail 720 of a housing 700, as shown in FIG. 7, adapted to contain electronic circuit cards, such as electronic circuit card 100. In one embodiment, each of prongs 108 is substantially hook-shaped and has a tip 180. Faceplate 102 also includes apertures (or cutouts) $110_1$ to $110_N$ for providing access to elements of circuit board 104, such as ports, LEDs, switches, or the like. One of apertures, e.g., aperture $110_1$, provides access to a craft port 112 of circuit board 104 and another aperture, e.g., aperture $110_2$, provides access to a data port 114 of circuit board 104, e.g., a DSX-1 interface or the like.

More specifically, faceplate 102 includes front 128 having edges 172 and 174. Front 128 has an end 136 that forms a portion of end 170 of faceplate 102 and an end 169. Tab 109 protrudes from end 136 and is integral with front 128. Sides 130 and 132 are respectively connected substantially perpendicularly to edges 172 and 174, as shown in FIGS. 1 and 2. Sides 130 and 132 respectively have ends 137 and 138, each aligned with end 136 of front 128 and each forming a portion of end 170 of faceplate 102. Prongs 108 respectively lie in the same plane as sides 130 and 132, are respectively integral with sides 130 and 132, and respectively protrude from ends 137 and 138.

In one embodiment, a handle 134 protrudes substantially perpendicularly from an edge of faceplate 102, e.g., from edge 172, and extends in a direction opposite to plates 130 and 132. Handle 134, in various embodiments, facilitates grasping faceplate 102. In one embodiment, handle 134 is used to initiate pivoting of faceplate 102 relative to circuit board 104. In some embodiments, sides 130 and 132 and handle 134 are integral with front 128, attached to front 128, e.g., by welding, or the like.

As stated above, aperture $110_1$ provides access to a craft port 112, e.g., an RS-232 port. In one embodiment, a personal computer, an emulation terminal, or the like, is connected to craft port 112 to monitor and/or alter the operation of circuit board 104. As stated above, aperture $110_2$ provides access to a data port 114, e.g., a DSX-1 interface, for monitoring data signals, e.g., DS1 signals or the like, to and from circuit board 104 via sockets 116 and 118 of data port 114, respectively. In one embodiment, data port 114 is a dual bantam jack or the like. In some embodiments, a monitor is connected to data port 114 to monitor the data signals to and from circuit board 104. In other embodiments, an embossment 140 in side 132 mates with a surface 142 of body 144 of port 114, as shown in FIGS. 1 and 2. This facilitates alignment between faceplate 102 and circuit board 104 in a direction substantially perpendicular to the direction of pivoting when faceplate 102 is pivoted into the position shown in FIG. 2.

In some embodiments, apertures $110_4$ and $110_N$ respectively provide access to LED display 124 and LED 126 for indicating the status of circuit board 104. In one embodiment, aperture $110_3$ provides access to switches 120 and 122, e.g., push buttons, of circuit board 104 that, for example, are adapted to scroll through menus of circuit board 104. In various embodiments, the menu items are displayed on LED display 124.

Figure 3:
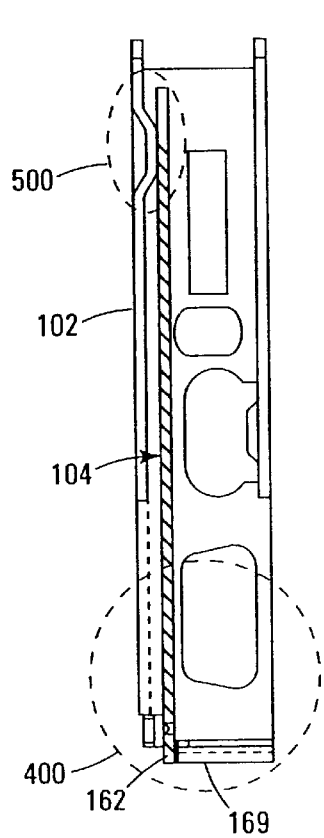
FIG. 3 is a back view of the electronic circuit card of FIG. 1.
Figure 4:
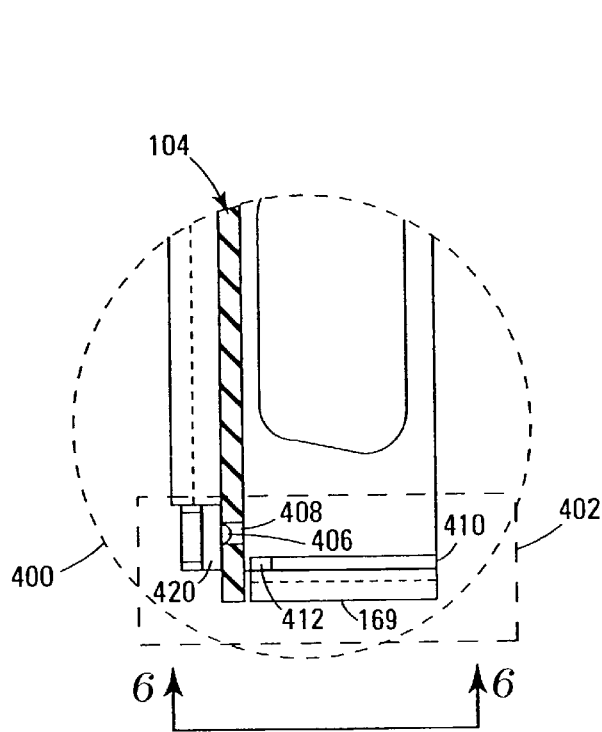
FIG. 4 is an enlarged view of region 400 of FIG. 3.
Figure 5:
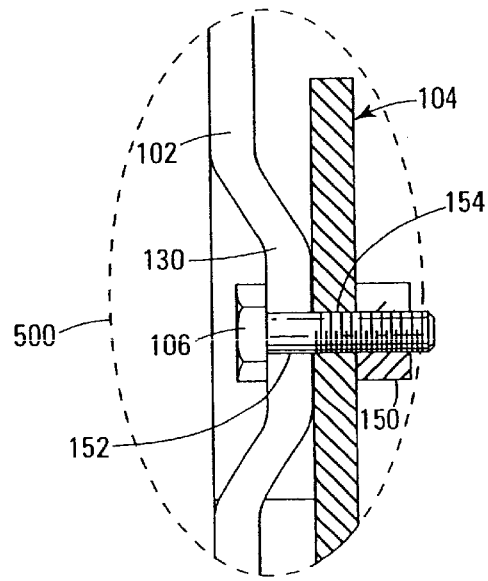
FIG. 5 is an enlarged view of region 500 of FIG. 3.

FIG. 3 is a back view of electronic circuit card 100 of FIG. 1 and provides a reference for FIGS. 4 and 5, respectively enlarged views of regions 400 and 500 of FIG. 3. FIG. 5 shows one embodiment of bolt 106 pivotally attaching faceplate 102 to circuit board 104. Bolt 106 passes through an aperture 152 in side 130 of faceplate 102 and an aperture 154 in circuit board 104. A nut 150 is threaded onto bolt 106 so as to maintain side 130 in abutment with circuit board 104 and to allow faceplate 102 to pivot about bolt 106. In one embodiment, as faceplate 102 is pivoted, bolt 106 rotates within aperture 154 of circuit board 104. In another embodiment, side 132 has an aperture 133, shown in FIG. 2, for providing access to nut 150. In some embodiments, a shaft, rivet, or the like is used instead of bolt 106 and nut 150.

Figure 6:
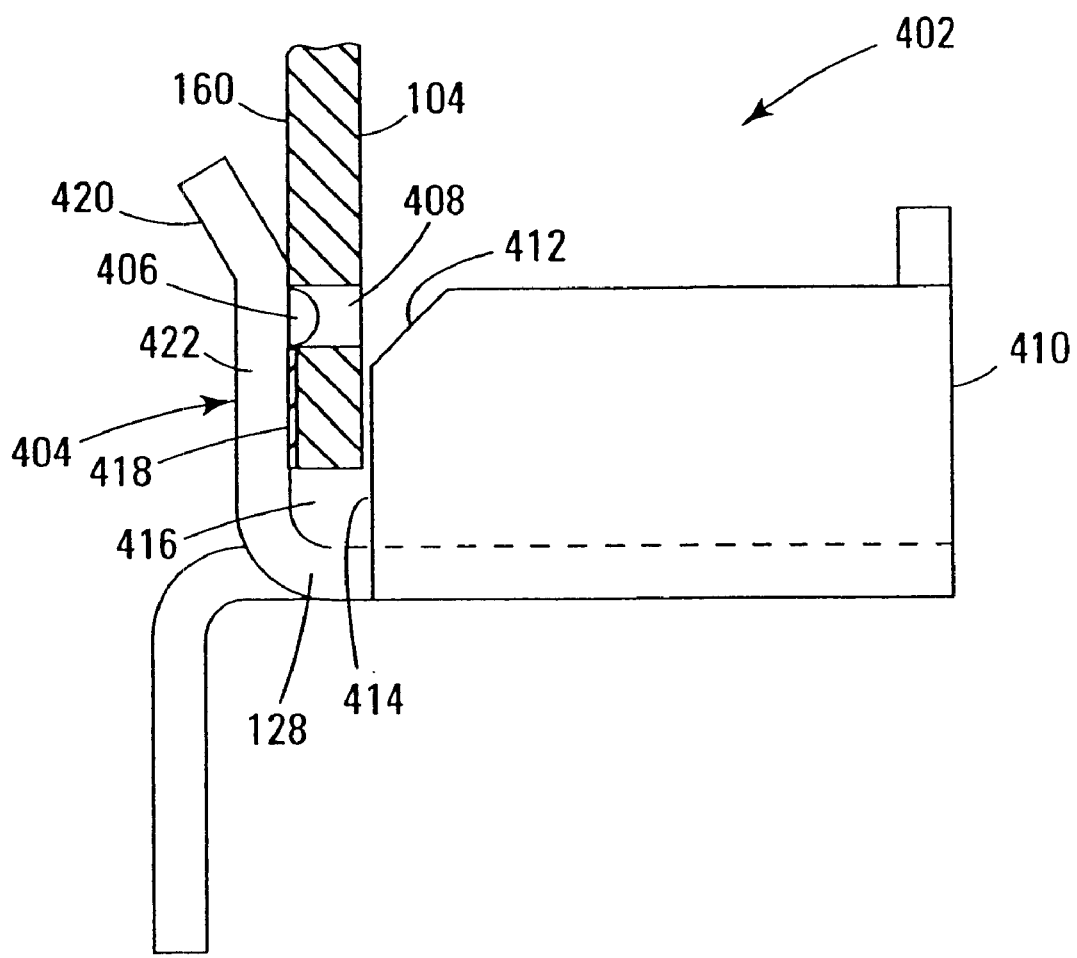
FIG. 6 is a view taken along line 6—6 of FIG. 4.

FIG. 4 and FIG. 6, where FIG. 6 is a view taken along line 6—6 of FIG. 4, illustrate a latch 402, according to an embodiment of the present invention. Latch 402 is disposed on faceplate 102 adjacent to end 169 of front 128. Latch 402 selectively latches faceplate 102 to circuit board 104 adjacent to corner 162 (shown in FIGS. 1 and 3) of faceplate 102. In one embodiment, latch 402 also selectively aligns faceplate 102 with circuit board 104. In various embodiments, selectively aligning faceplate 102 with circuit board 104 includes aligning faceplate 102 and circuit board 104 in a direction substantially perpendicular to the direction faceplate 102 pivots and/or substantially parallel to an edge 165, shown in FIGS. 1 and 2, of circuit board 104.

In various embodiments, latch 402 includes an arm 404 having a protrusion 406. Arm 404 is connected substantially perpendicularly to front 128, as shown in FIGS. 1 and 6. In one embodiment, arm 404 is integral with front 128, attached to front 128, e.g., by welding, or the like. In other embodiments, latch 402 has a plate 410 that has a beveled edge 412 and an edge 414 adjacent to beveled edge 412. In one embodiment, plate 410 is integral with front 128, attached to front 128, e.g., by welding, or the like at end 169 of front 128 and projects at an angle from front 128 in the direction of circuit board 104, as shown in FIGS. 1, 2, and 7.

Arm 404 and plate 410 define a slot 416 between them for receiving circuit board 104 adjacent to corner 162 when faceplate 102 is pivoted into the position of FIGS. 1–4 and 6. In this position, arm 404 bears against a portion of side 160 of circuit board 104, and protrusion 406 extends into an aperture 408 of circuit board 104 to latch faceplate 102 to circuit board 104. In one embodiment, extension of protrusion 406 into an aperture 408 also aligns faceplate 102 substantially parallel to edge 165 of circuit board 104. In another embodiment, as faceplate 102 is pivoted into the position shown in FIGS. 1–4 and 6, embossment 140 engages surface 142 of body 144 of data port 114 and forces arm 404 against side 160 of circuit board 104, thereby aligning faceplate 102 and circuit board 104 in a direction substantially perpendicular to the direction in which faceplate 102 pivots. In another embodiment, arm 404 bears against a grounding pad 418 disposed on surface. 160 around aperture 408. In other embodiments, arm 404 includes a portion 420 that projects from portion 422 of arm 404 at an angle, as shown in FIG. 6. In one embodiment, portion 420 of arm 404 and beveled edge 412 of plate 410 act to guide circuit board 104 into slot 416 when faceplate 102 is pivoted into the position of FIGS. 1–4 and 6.

FIG. 7 illustrates electronic circuit card 100 positioned in housing 700 adapted to contain electronic circuit cards, such as line cards or the like, according to an embodiment of the present invention. In some embodiments, housing 700 is contained in a rack of a central office, in a remote unit, e.g., a digital loop carrier, or the like. Housing 700 has a number of slots, each adapted to receive one electronic circuit card 100. Housing 700 also has a socket disposed at one end of each slot, e.g., opposite to an end 705 of housing 700, for receiving a plug 164 (shown in FIG. 2), e.g., an edge connector, of circuit board 104 of electronic circuit card 100. Such housings are well known in the art and will not be described further here.

Figure 9:
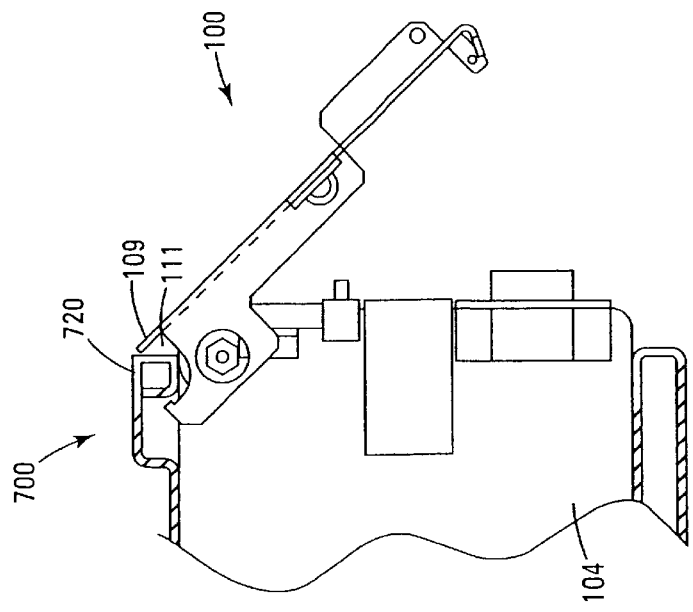
FIGS. 7–9 illustrate an embodiment of a method for removing an electronic circuit card from a housing according to the teachings of the present invention.
Figure 8:
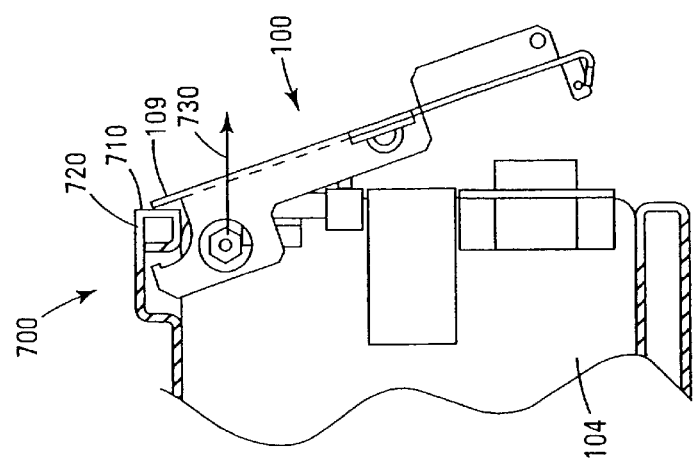

In the position illustrated in FIG. 7, electronic circuit card 100 is disposed in one of the slots, faceplate 102 is positioned as in FIGS. 1–4 and 6 and as described above, tab 109 abuts a surface 710 of a rail 720 of housing 700, plug 164 is inserted into the socket, and rail 720 protrudes into gap 111. In one embodiment, a gap 740 separates tip 180 of each of prongs 108 and a surface 750 of rail 720, as shown in FIG. 7. In some embodiments, gap 740 provides clearance, for example, to facilitate pivoting of faceplate 102 and to allow for manufacturing tolerances of the electronic circuit cards and enclosure. To remove electronic circuit card 100 from housing 700, faceplate 102 is pivoted into the position shown in FIG. 8 by pulling on handle 134. While pivoting between the positions shown in FIGS. 7 and 8, tab 109 of faceplate 102 bears against surface 710 of a rail 720 of housing 700, as shown in FIGS. 7 and 8. In this way, faceplate 102 acts as a lever that imparts a longitudinal force to circuit board 104 via the pivot, e.g., bolt 106, that pulls circuit board 104 from the position shown in FIG. 7 to the position shown in FIG. 8, as indicated by arrow 730. This also pulls plug 164 from the socket. Continued pivoting of faceplate 102 pulls circuit board 104 from the position shown in FIG. 8 to the position shown in FIG. 9, where plug 164 is disengaged from the socket. Electronic circuit card 100 is subsequently slid from housing 700.

Figure 10:
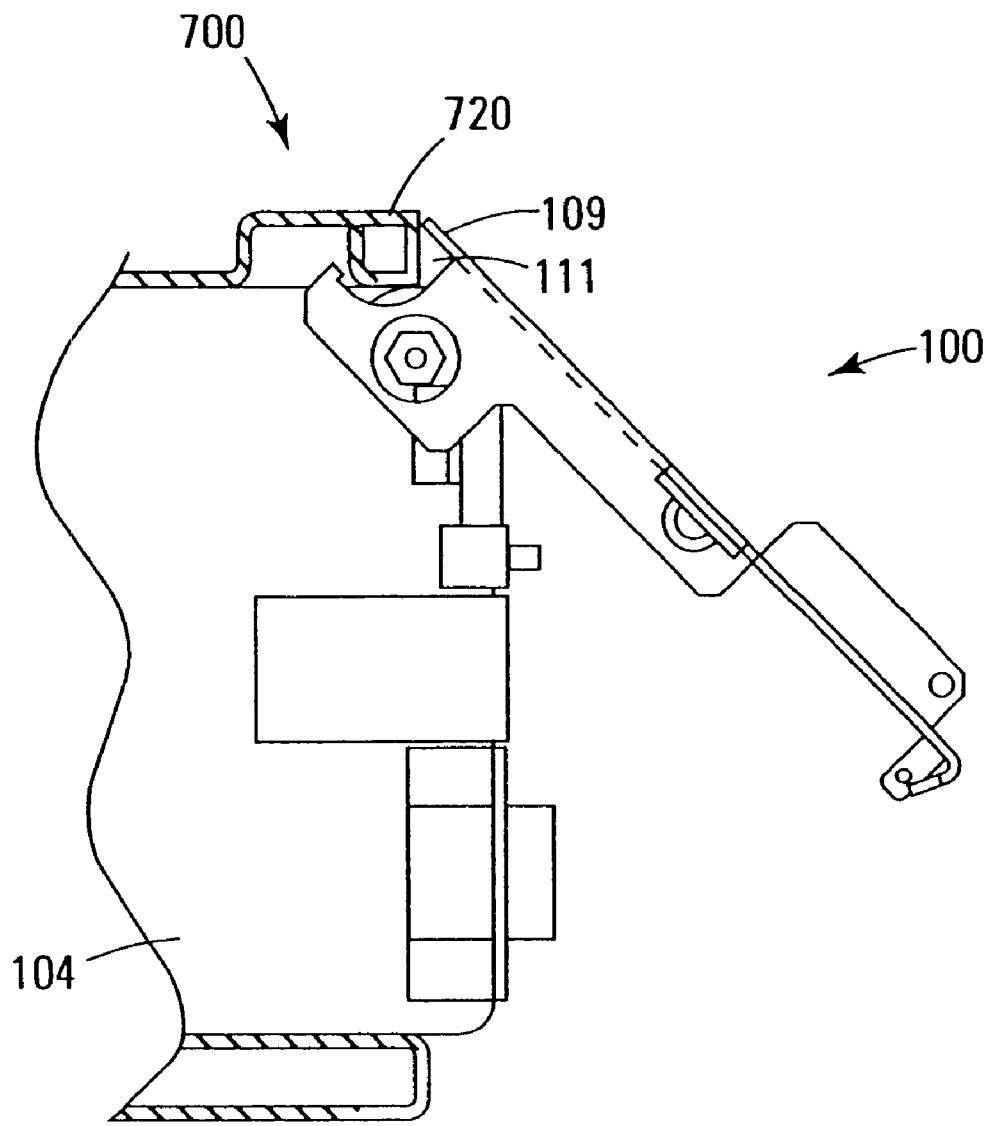
FIGS. 10–14 illustrate an embodiment of a method for inserting an electronic circuit card into a housing according to the teachings of the present invention.
Figure 11:
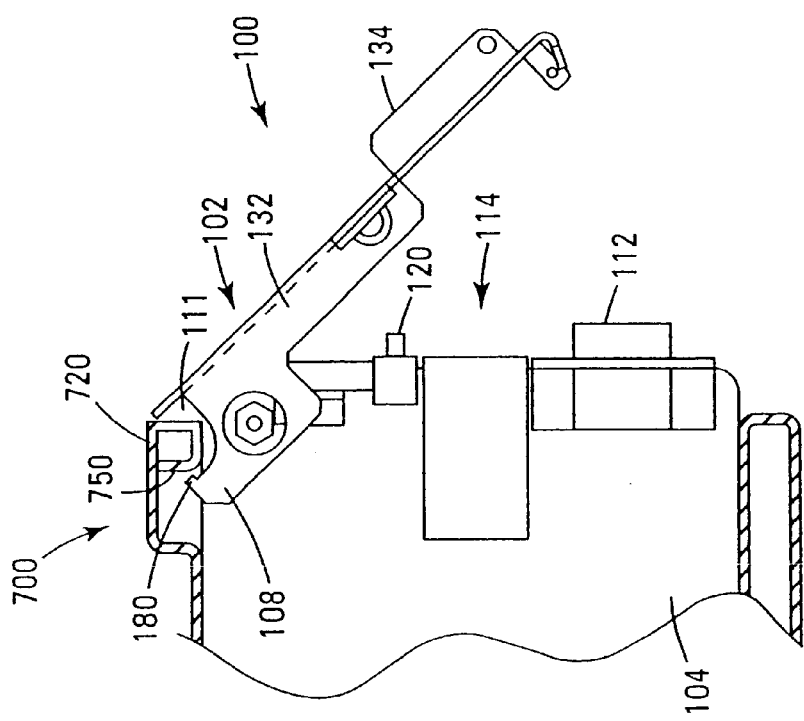

To insert electronic circuit card 100 into housing 700, electronic circuit card 100 is slid into a slot of housing 700 so that plug 164 is aligned with the socket at the end of the slot. In one embodiment, faceplate 102 is pivoted away from circuit board 104 so that prongs 108 move past rail 720 of housing 700. This enables rail 720 to be received in gap 111 as faceplate is slid further into housing 700 and into the position shown in FIG. 10, where plug 164 is disengaged from the socket. Faceplate 102 is then pivoted from the position shown in FIG. 10 to the position shown in FIG. 11 so that prongs 108 engage surface 750 of rail 720 of housing 700 at tips 180. Pushing on handle 134, in one embodiment, pivots faceplate 102. Faceplate 102 is then pivoted from the position shown in FIG. 11 to the position shown in FIG. 12. This causes faceplate 102 to act as a lever that imparts a longitudinal force to circuit board 104 via the pivot, e.g., bolt 106, that pushes circuit board 104 from the position shown in FIG. 11 to the position shown in FIG. 12, as indicated by arrow 1200. This also pushes plug 164 into the socket.

Figure 12:
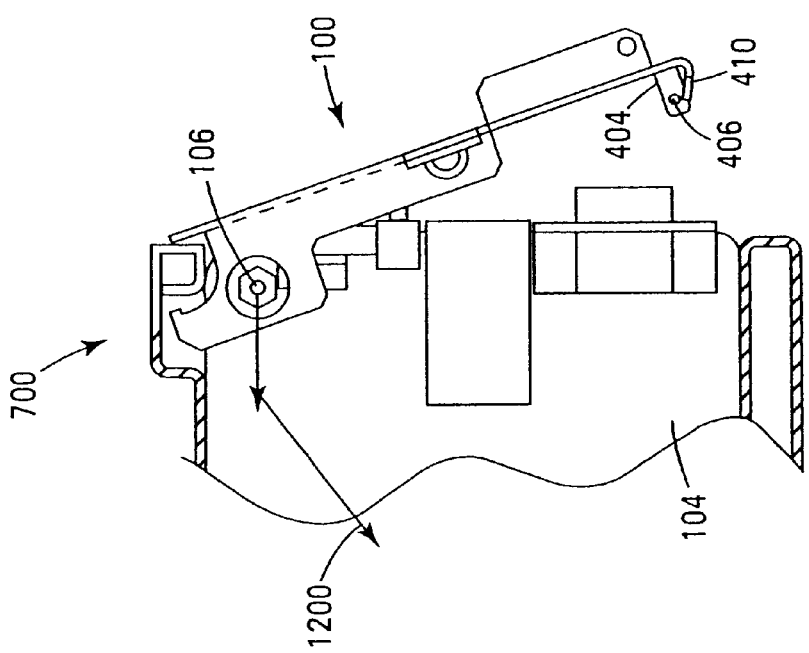
Figure 14:
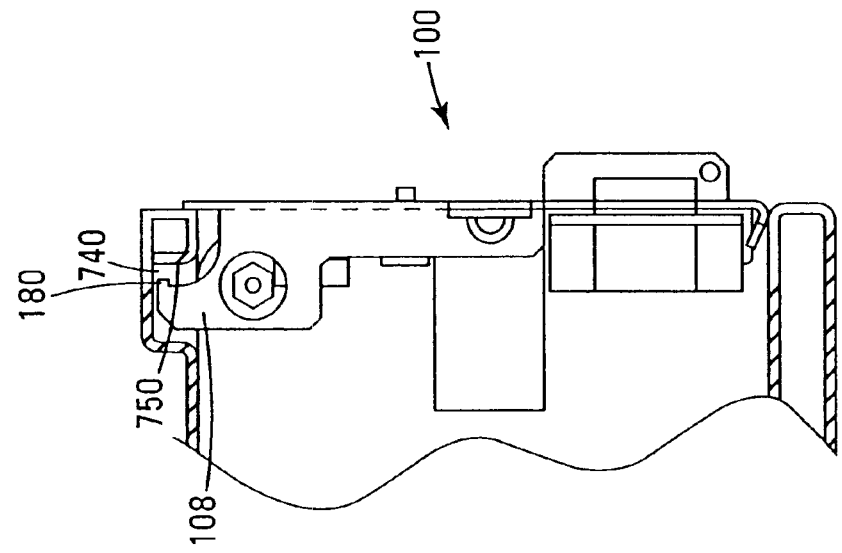
Figure 13:
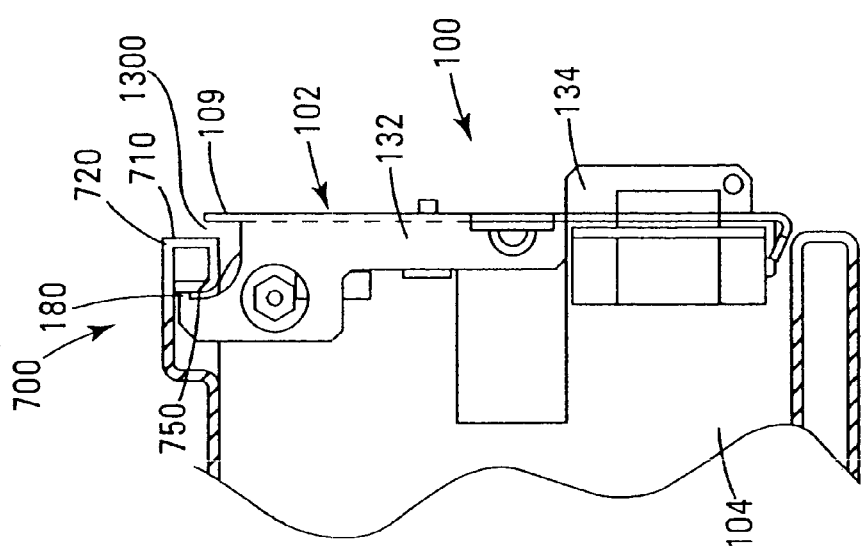

Continued pivoting of faceplate 102 pushes circuit board 104 from the position shown in FIG. 12 to the position shown in FIG. 13. In this position, faceplate 102 is positioned as shown in FIGS. 1–4 and 6, plug 164 is electrically connected to the socket, tips 180 still engage surface 750 of rail 720, and a gap 1300 separates tab 109 from surface 710 of rail 720. Moreover, latch 402, in one embodiment, latches faceplate 102 to circuit board 104, as shown in FIGS. 4 and 6 and as described above. In another embodiment, latch 402 also aligns faceplate 102 with circuit board 104. In other embodiments, electronic circuit card 100 is pushed, e.g., using handle 134, from the position shown in FIG. 13 to the position shown in FIG. 14. In this position, tab 109 abuts a surface 710 of rail 720, and gap 740 separates tip 180 of each of prongs 108 and surface 750 of rail 720.

Figure 15:
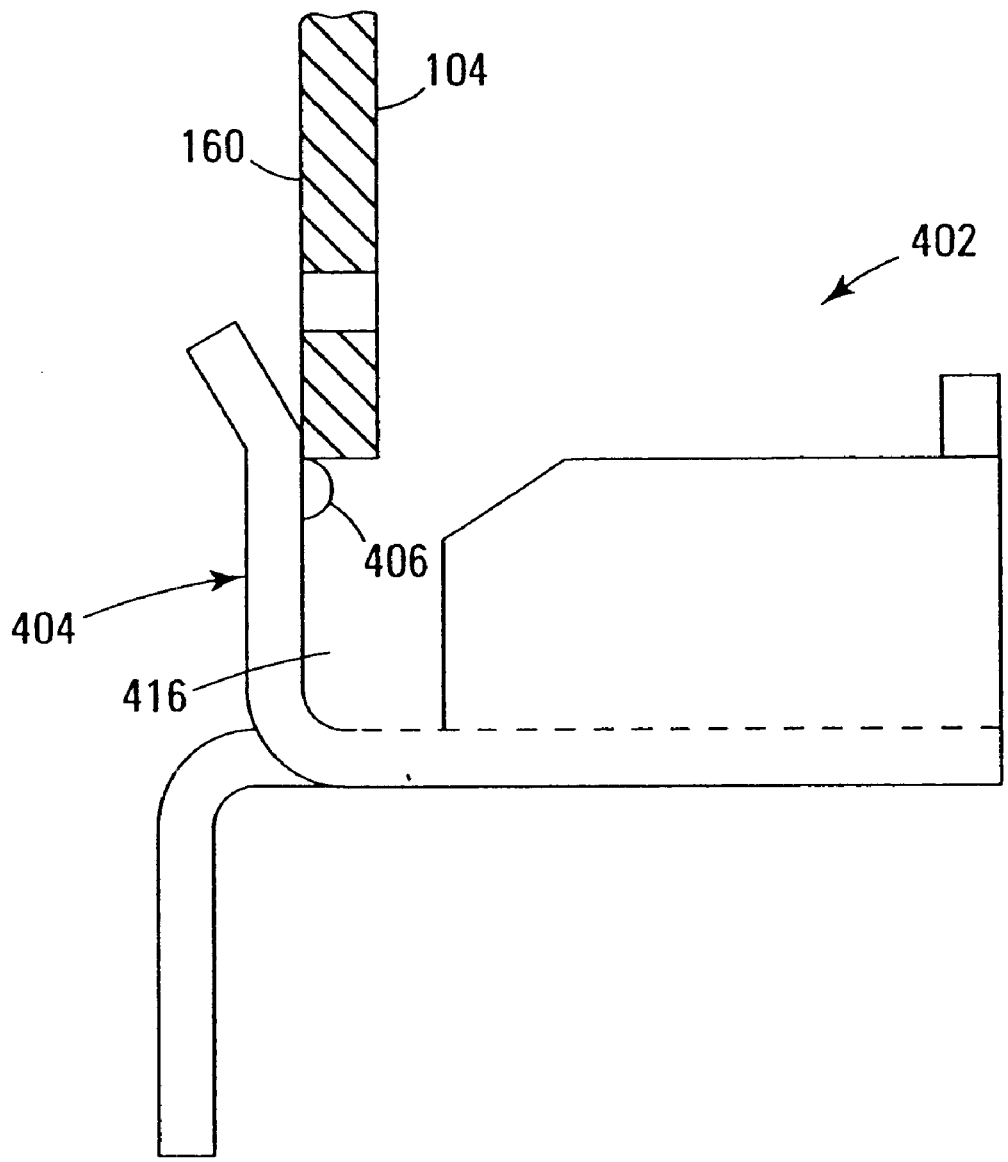
FIGS. 15 and 16 illustrate a circuit board of the electronic circuit card of FIG. 1 being received in slot of a faceplate of the electronic circuit card of FIG. 1 according to an embodiment of the present invention.
Figure 16:
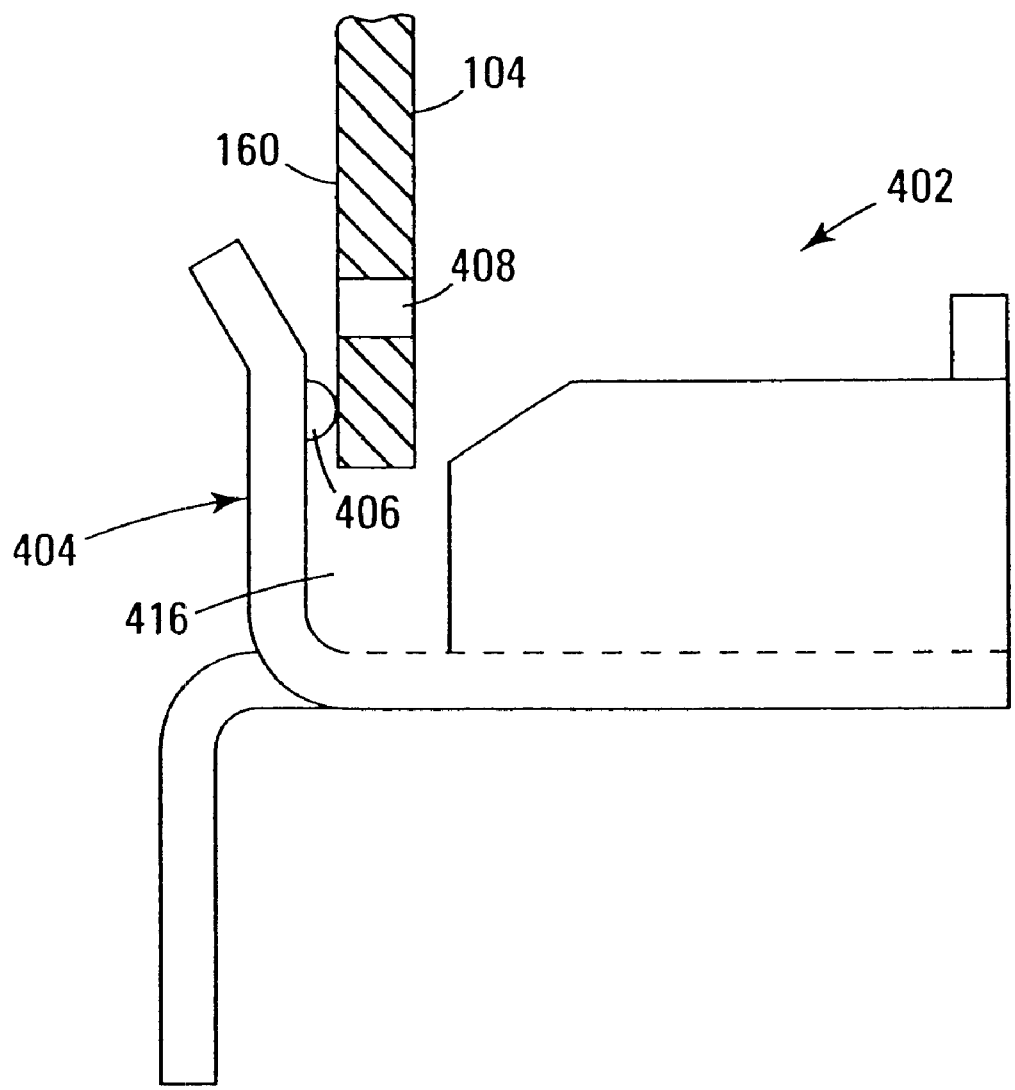

FIGS. 15 and 16 illustrate circuit board 104 being received in slot 416 of latch 402 as faceplate 102 is pivoted from the position shown in FIG. 12 to the position shown in FIG. 13. As faceplate 102 pivots, in various embodiments, protrusion 406 of arm 404 of latch 402 engages circuit board 104, as shown in FIG. 15. As faceplate 102 continues to pivot, circuit board 104 deflects faceplate 102 so that protrusion 406 rides on surface 160 of circuit board 104, as shown in FIG. 16, until protrusion 406 aligns with aperture 408 of circuit board 104. When protrusion 406 aligns with aperture 408 of circuit board 104, surface 160 of circuit board 104 moves against arm 404 and protrusion 406 is received in aperture 408, as shown in FIG. 6, thus latching faceplate 102 to circuit board 104. As described above for one embodiment, receiving protrusion 406 into an aperture 408 also aligns faceplate 102 substantially parallel with edge 165 of circuit board 104. For another embodiment, embossment 140 engages surface 142 of body 144 of data port 114. This moves faceplate in a direction substantially perpendicular to the direction of pivoting and forces arm 404 against side 160 of circuit board 104 and thereby aligns circuit board 104 and faceplate 102 in a direction substantially perpendicular to the direction of pivoting.

Figure 17:
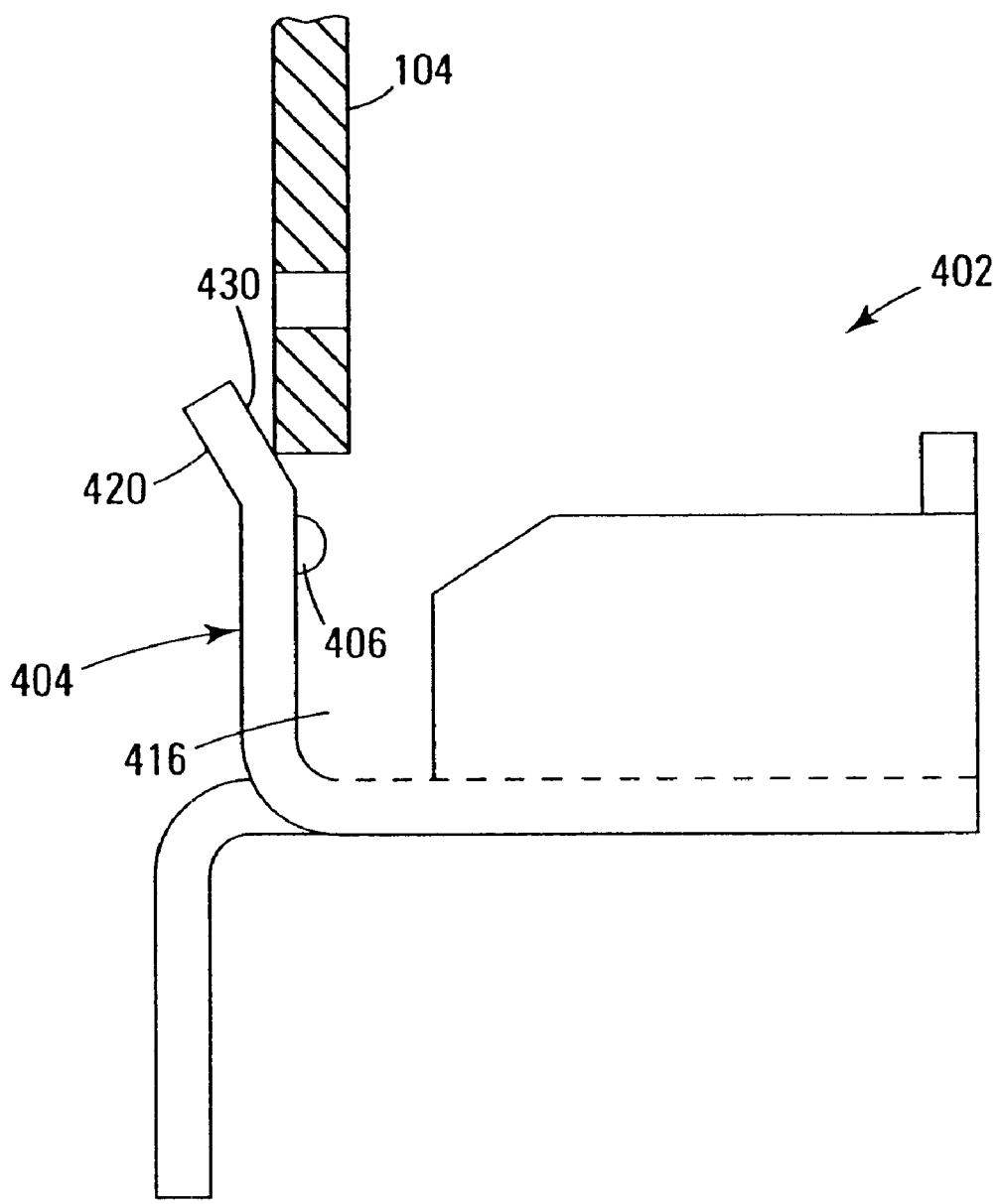
FIG. 17 illustrates a circuit board of the electronic circuit card of FIG. 1 being received in slot of a faceplate of the electronic circuit card of FIG. 1 according to another embodiment of the present invention.

In some embodiments, circuit board 104 engages angled surface 430 of arm 404 of latch 402, e.g., as shown in FIG. 17, before engaging protrusion 406. For one embodiment, embossment 140 engages surface 142 of body 144 of data port 114. This moves faceplate in a direction substantially perpendicular to the direction of pivoting and forces angled surface 430 of arm 404 against side 160 of circuit board 104. As faceplate 102 pivots, circuit board 104 rides on surface 430 and deflects faceplate 102 into the position shown in FIG. 15, so that circuit board 104 aligns with slot 416 of latch 402. In this way, circuit board 104 is guided into slot 416. This aligns faceplate 102 and circuit board 104 in the direction substantially perpendicular to the direction of pivoting.

Figure 18:
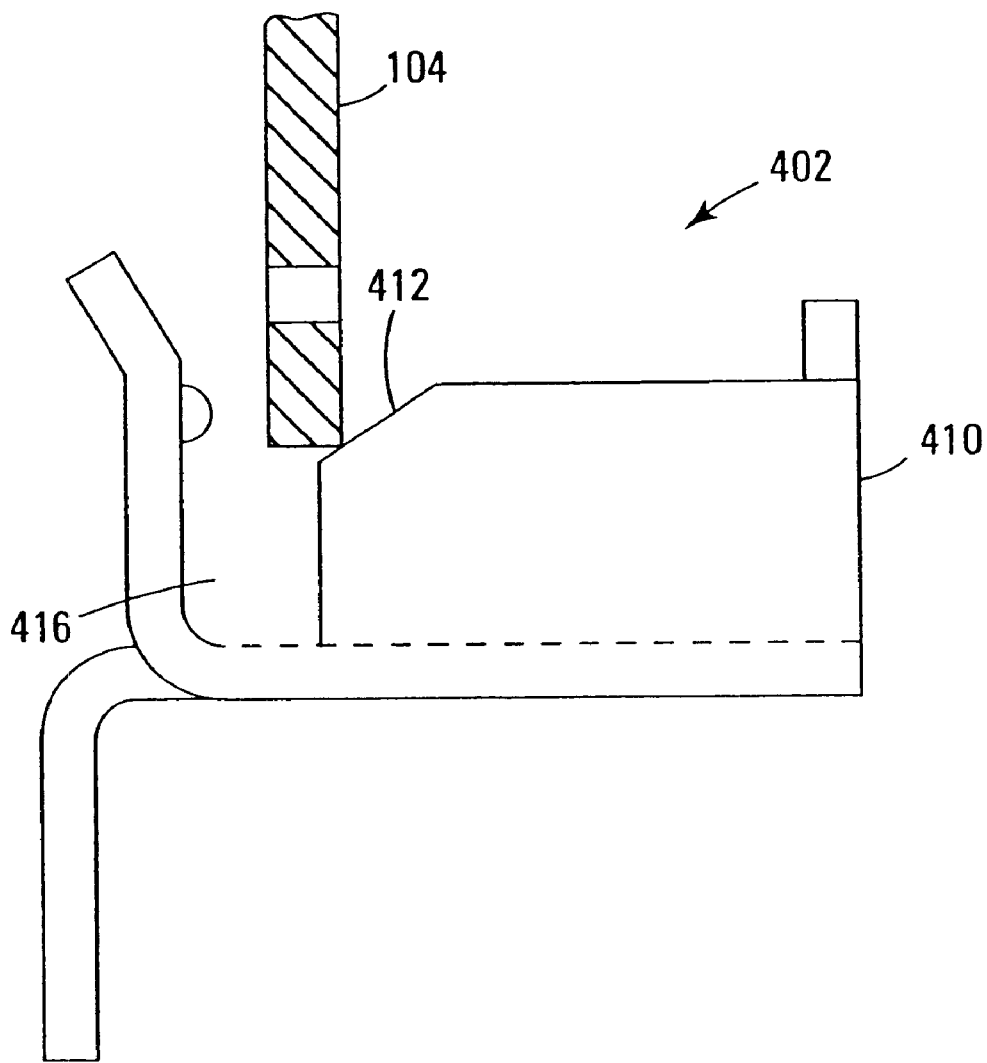
FIG. 18 illustrates a circuit board of the electronic circuit card of FIG. 1 being received in slot of a faceplate of the electronic circuit card of FIG. 1 according to yet another embodiment of the present invention.

In one embodiment, circuit board 104 engages beveled edge 412 of plate 410 of latch 402, e.g., as shown in FIG. 18, before engaging protrusion 406. As faceplate 102 pivots, circuit board 104 rides on beveled edge 412 and deflects faceplate 102 into the position shown in FIG. 16, for example, thus guiding circuit board 104 into slot 416. This aligns faceplate 102 and circuit board 104 in the direction substantially perpendicular to the direction of pivoting. For one embodiment, embossment 140 engages surface 142 of body 144 of data port 114. This moves faceplate in a direction substantially perpendicular to the direction of pivoting so that as faceplate pivots circuit board 104 engages beveled edge 412.

CONCLUSION

Embodiments of the present invention have been described. The embodiments provide faceplates for electronic circuit cards, such as line cards or the like. In one embodiment, a faceplate has two prongs protruding from an end of the faceplate respectively at each of two sides of the faceplate. This provides additional faceplate area for elements of the electronic circuit card, such as ports, LEDs, switches, or the like, compared to faceplates that have a single prong attached to the back of these faceplates. Moreover, each of the two prongs are less likely to become deformed or bent after repeated insertions of the electronic circuit card than a single prong because the two prongs bear forces during each insertion of the electronic circuit card otherwise born by the single prong. The two prongs also reduce the vibration of the electronic circuit card compared to the vibration of electronic circuit cards having a single prong by providing two points of contact with the housing for improved stability.

Although specific embodiments have been illustrated and described in this specification, it will be appreciated by those of ordinary skill in the art that any arrangement that is calculated to achieve the same purpose may be substituted for the specific embodiment shown. This application is intended to cover any adaptations or variations of the present invention. For example, bolt 106 can pass though both of sides 130 and 132 instead of passing only through side 130, as shown in FIG. 5. Moreover, handle 134 can protrude from edge 174 of front 128, from front 128 at a location between edges 172 and 174, or from end 169 of front 128 rather than from edge 172, as shown in FIG. 1. Handle 134 can protrude from faceplate 102 at angles from perpendicular instead of perpendicularly, as shown in FIG. 1.

What is claimed is:

1. A faceplate for a circuit board comprising:
   first and second prongs protruding from a first end of the faceplate respectively at first and second sides of the faceplate, the first and second prongs adapted to engage a housing to aid in inserting the circuit board into the housing;
   a tab protruding from the first end of the faceplate at a front of the faceplate, the tab lying substantially between the first and second prongs, the tab adapted to engage the housing to aid in extracting the circuit board from the housing; and
   a latch disposed on the faceplate adjacent a second end of the faceplate for selectively latching the faceplate to the circuit board, wherein the latch comprises:
      an arm connected to the faceplate adjacent the second end of the faceplate, the arm having a protrusion adapted to extend into an aperture in the circuit board to latch the faceplate to the circuit board; and
      a plate projecting from the second end of the faceplate so that the plate and the arm define a slot therebetween adapted to receive the circuit board;
      wherein the arm comprises a portion that projects from the arm at an angle adapted to guide the circuit board into the slot.

2. The faceplate of claim 1, wherein the first and second prongs are substantially hook-shaped.

3. The faceplate of claim 1, wherein the latch is adaptable to selectively align the faceplate with the circuit board.

4. The faceplate of claim 1, wherein the latch is engageable with a grounding pad disposed on the circuit board.

5. The faceplate of claim 1, wherein the latch comprises a protrusion adapted to extend into an aperture in the circuit board.

6. The faceplate of claim 5, wherein the protrusion is adaptable to extend into the aperture to latch the faceplate to the circuit board.

7. The faceplate of claim 6, wherein the protrusion extends into the aperture to align the faceplate substantially perpendicular with an edge of the circuit board.

8. The faceplate of claim 1, wherein the latch comprises at least one angled surface adapted to guide the circuit board into a slot of the latch.

9. The faceplate of claim 1, wherein the plate comprises a beveled edge adapted to guide the circuit board into the slot.

10. The faceplate of claim 1, wherein each of the first and second prongs comprises a tip adapted to engage the housing.

11. The faceplate of claim 1, further comprising a handle protruding from the front of the faceplate.

12. The faceplate of claim 1, wherein one of a plurality of apertures in the faceplate is adaptable to provide access to a craft port of the circuit board and another of the plurality of apertures is adaptable to provide access to a data port of the circuit board.

13. The faceplate of claim 1, wherein at least one of the first or second sides is pivotally attachable to the circuit board.

14. A faceplate for a circuit board comprising:
   a tab extending from a first end of a front of the faceplate, the tab adapted to engage a housing to aid in extracting the circuit board from the housing;
   first and second sides connected substantially perpendicularly to the front, at least one of the first and second sides pivotally connectable to the circuit board;
   first and second prongs respectively extending from an end of the first and second sides such that the tab lies between the first and second prongs, the first and second prongs adapted to engage the housing to aid in inserting the circuit board into the housing;
   a handle connected to the front; and
   a latch disposed on the faceplate adjacent to a second end of the faceplate for selectively latching the faceplate to the circuit board;
   wherein the latch comprises:
      an arm connected to the faceplate adjacent the second end of the faceplate, the arm having a protrusion adapted to extend into an aperture in the circuit board to latch the faceplate to the circuit board; and
      a plate projecting from the second end of the faceplate so that the plate and the arm define a slot therebetween for receiving the circuit board,
      wherein the arm comprises a portion that projects from the arm at an angle for guiding the circuit board into the slot.

15. The faceplate of claim 14, wherein one of a plurality of apertures of the faceplate provides access to a craft port of the circuit board and another of the plurality of apertures provides access to a data port of the circuit board.

16. The faceplate of claim 14, wherein the first and second prongs are substantially hook-shaped.

17. The faceplate of claim 14, wherein the latch is engagable with a grounding pad disposed on the circuit board.

18. The faceplate of claim 14, wherein the latch comprises a protrusion adapted to extend into an aperture in the circuit board.

19. The faceplate of claim 14, wherein the latch comprises at least one angled surface adapted to guide the circuit board into a slot of the latch.

20. An electronic circuit card comprising:

a circuit board;

a faceplate pivotally attached to the circuit board;

two prongs protruding from a first end of the faceplate so as to straddle the circuit board, each of the two prongs adapted to engage a housing to aid in inserting the electronic circuit card into the housing as the faceplate pivots in a first direction relative to the circuit board;

a tab protruding from the first end of the faceplate, the tab adapted to engage the housing to aid in extracting the electronic circuit card from the housing as the faceplate pivots in a second direction relative to the circuit board; and a latch disposed on the faceplate adjacent a second end of the faceplate for selectively latching the faceplate to the circuit board, the latch comprising:

an arm connected to the faceplate adjacent the second end of the faceplate, the arm having a protrusion adapted to extend into an aperture in the circuit board to latch the faceplate to the circuit board; and a plate projecting from the second end of the faceplate so that the plate and the arm define a slot therebetween for receiving the circuit board;

wherein the arm comprises a portion that projects from the arm at an angle adapted to guide the circuit board into the slot.

21. The electronic circuit card of claim 20, wherein the latch also selectively aligns the faceplate with the circuit board.

22. The electronic circuit card of claim 20, wherein the latch is engageable with a grounding pad disposed on the circuit board.

23. The electronic circuit card of claim 20, wherein the latch comprises a protrusion adapted to extend into an aperture in the circuit board.

24. The electronic circuit card of claim 20, wherein the latch comprises at least one angled surface adapted to guide the circuit board into a slot of the latch.

25. The electronic circuit card of claim 20, wherein the plate comprises a beveled edge adapted to guide the circuit board into the slot.

26. The electronic circuit card of claim 20, wherein each of the two prongs is substantially hook-shaped.

27. The electronic circuit card of claim 20, wherein the tab protrudes from a front of the faceplate.

28. The electronic circuit card of claim 20, wherein each of the two prongs respectively protrudes from first and second sides of the faceplate.

29. The electronic circuit card of claim 20, wherein each of the two prongs comprises a tip for engaging the housing.

30. The electronic circuit card of claim 20, further comprising a handle protruding from the faceplate.

31. The electronic circuit card of claim 20, wherein one of a plurality of apertures of the faceplate provides access to a craft port of the circuit board and another of the plurality of apertures provides access to a data port of the circuit board.

32. An electronic circuit card comprising:

a circuit board;

a faceplate pivotally attached to the circuit board;

first and second substantially hook-shaped prongs protruding from a first end of the faceplate respectively at first and second sides of the faceplate, the first and second prongs adapted to engage a housing for imparting a longitudinal force to the circuit board for pushing the circuit board into the housing as the faceplate pivots in a first direction relative to the circuit board;

a tab protruding from a front of the faceplate at the first end of the faceplate, the tab lying substantially between the first and second prongs, the tab adapted to engage the housing for imparting a longitudinal force to the circuit board for pulling the circuit board from the housing as the faceplate pivots in a second direction relative to the circuit board;

a handle protruding from the front of the faceplate; and a latch disposed adjacent a second end of the faceplate for selectively latching the faceplate to the circuit board, wherein the latch comprises:

an arm connected to the faceplate adjacent the second end of the faceplate, the arm having a protrusion adapted to extend into an aperture in the circuit board to latch the faceplate to the circuit board; and a plate projecting from the second end of the faceplate so that the plate and the arm define a slot therebetween for receiving the circuit board, wherein the arm comprises a portion that projects from the arm at an angle for guiding the circuit board into the slot.

33. The electronic circuit card of claim 32, wherein the latch also selectively aligns the faceplate with the circuit board.

34. The electronic circuit card of claim 32, wherein the latch is engageable with a grounding pad disposed on the circuit board.

35. The electronic circuit card of claim 32, wherein the latch comprises a protrusion adapted to extend into an aperture in the circuit board.

36. The electronic circuit card of claim 32, wherein the latch comprises at least one angled surface adapted to guide the circuit board into a slot of the latch.

37. The electronic circuit card of claim 32, wherein the plate comprises a beveled edge for guiding the circuit board into the slot.

38. The electronic circuit card of claim 32, wherein one of a plurality of apertures of the faceplate provides access to a craft port of the circuit board and another of the plurality of apertures provides access to a data port of the circuit board.

39. A method for inserting an electronic circuit card into a housing for containing the electronic circuit card, the method comprising:

receiving a rail of the housing between a tab and a pair of prongs of a faceplate of the electronic circuit card, the tab and the pair of prongs protruding from a first end of the faceplate, the pair of prongs straddling a circuit board of the electronic circuit card;

pivoting the faceplate relative to the circuit board so that each of the pair of prongs engages the rail so as to impart a longitudinal force to the circuit board for pushing the circuit board into the housing; and latching the faceplate to the circuit board adjacent a second end of the faceplate, comprising:

defining a slot between a plate, projecting from the second end of the faceplate, and an arm connected to the faceplate adjacent the second end of the faceplate; and receiving a protrusion of the arm in an aperture of the circuit board;

wherein the arm comprises a portion that projects from the arm at an angle for guiding the circuit board into the slot.

40. The method of claim 39, further comprising sliding the circuit board of the electronic circuit card into the housing prior to receiving the rail of the housing between the tab and the pair of prongs.

41. The method of claim 39, wherein receiving the protrusion of the faceplate in the aperture of the circuit board aligns the faceplate substantially perpendicular to an edge of the circuit board.

42. The method of claim 39, further comprising aligning the faceplate with the circuit board.

43. The method of claim 42, wherein aligning the faceplate with the circuit board comprises aligning the faceplate substantially parallel with an edge of the circuit card.

44. The method of claim 43, wherein aligning the faceplate substantially parallel with and edge of the circuit card comprises receiving a protrusion of the faceplate in an aperture of the circuit board.

45. The method of claim 42, wherein aligning the faceplate with the circuit board comprises aligning the faceplate and the circuit board in a direction substantially perpendicular to a direction of pivoting the faceplate as the faceplate is pivoting.

46. The method of claim 45, wherein aligning the faceplate and the circuit board in the direction substantially perpendicular to the direction of pivoting the faceplate comprises engaging the circuit board with an embossment of the faceplate to move the faceplate in the direction substantially perpendicular to the direction of pivoting.

47. The method of claim 39, further comprising receiving the circuit board in a slot of the faceplate adjacent a second end of the faceplate.

48. The method of claim 47, wherein receiving the circuit board in the slot of the faceplate comprises deflecting the faceplate so that the circuit board aligns with the slot of the faceplate.

49. The method of claim 48, wherein deflecting the faceplate comprises the circuit board engaging a beveled edge of the plate projecting from the second end of the faceplate.

50. The method of claim 48, wherein deflecting the faceplate comprises the circuit board engaging the arm connected to the faceplate adjacent the second end of the faceplate.

51. The method of claim 47, wherein receiving the circuit board in the slot of the faceplate comprises:

engaging the circuit board with a protrusion of the faceplate;

deflecting the faceplate so the protrusion rides on a surface of the circuit board; and receiving the protrusion in an aperture of the circuit board to latch the faceplate to the circuit board.

52. The method of claim 51, wherein receiving the protrusion in the aperture aligns the faceplate substantially parallel to an edge of the circuit board.

53. The method of claim 39, wherein pivoting the faceplate comprises pushing on a handle protruding from the faceplate.

54. The method of claim 39, further comprising receiving a plug of the circuit board in a socket of a connector of the housing.

\* \* \* \* \*